United States Patent
Park et al.

(10) Patent No.: US 8,945,951 B2
(45) Date of Patent: Feb. 3, 2015

(54) LEAD FRAME AND MANUFACTURING METHOD THEREOF

(75) Inventors: Chang Hwa Park, Seoul (KR); Eun Jin Kim, Seoul (KR); Jin Young Son, Seoul (KR); Kyoung Taek Park, Seoul (KR); In Kuk Cho, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 677 days.

(21) Appl. No.: 13/062,245

(22) PCT Filed: Sep. 7, 2009

(86) PCT No.: PCT/KR2009/005057
§ 371 (c)(1),
(2), (4) Date: Jun. 21, 2011

(87) PCT Pub. No.: WO2010/027231
PCT Pub. Date: Mar. 11, 2010

(65) Prior Publication Data
US 2011/0272184 A1    Nov. 10, 2011

(30) Foreign Application Priority Data
Sep. 5, 2008  (KR) .................. 10-2008-0087689

(51) Int. Cl.
*H01L 21/00* (2006.01)
*H01L 23/495* (2006.01)

(52) U.S. Cl.
CPC .... *H01L 23/49582* (2013.01); *H01L 23/49548* (2013.01); *H01L 2224/85439* (2013.01)
USPC .............................. 438/10; 257/676; 438/123

(58) Field of Classification Search
CPC .................. H01L 23/49548; H01L 23/49582; H01L 2224/85439

USPC .............................. 438/10, 106, 123; 257/676
See application file for complete search history.

(56) References Cited

U.S. PATENT DOCUMENTS

| | | | |
|---|---|---|---|
| 5,334,346 A | 8/1994 | Kim et al. | |
| 5,449,951 A | 9/1995 | Parthasarathi et al. | |
| 5,585,195 A | 12/1996 | Shimada | |
| 5,846,346 A | 12/1998 | Lee et al. | |
| 6,037,653 A * | 3/2000 | Kim et al. | 257/666 |
| 6,150,713 A * | 11/2000 | Park et al. | 257/677 |
| 6,376,921 B1 * | 4/2002 | Yoneda et al. | 257/787 |
| 6,864,423 B2 * | 3/2005 | Tan et al. | 174/536 |
| 7,462,926 B2 * | 12/2008 | Fu et al. | 257/677 |

(Continued)

FOREIGN PATENT DOCUMENTS

| | | |
|---|---|---|
| JP | 62-018744 A | 1/1987 |
| JP | 06-001798 B | 1/1994 |

(Continued)

OTHER PUBLICATIONS

Office Action dated Sep. 15, 2011 in Korean Application No. 10-2008-0087689, filed Sep. 5, 2008.

(Continued)

*Primary Examiner* — Long K Tran
*Assistant Examiner* — Dzung Tran
(74) *Attorney, Agent, or Firm* — Saliwanchik, Lloyd & Eisenschenk

(57) ABSTRACT

Disclosed are a lead frame and a method for manufacturing the same. The lead frame includes a copper substrate and a rough copper layer having surface roughness of 110 nm to 300 nm on a surface of the copper substrate.

14 Claims, 4 Drawing Sheets

(56) References Cited

U.S. PATENT DOCUMENTS

| | | | |
|---|---|---|---|
| 8,564,107 B2* | 10/2013 | Cho et al. | 257/666 |
| 2002/0153596 A1* | 10/2002 | Tsubosaki et al. | 257/666 |
| 2004/0232534 A1* | 11/2004 | Seki et al. | 257/678 |
| 2006/0231931 A1 | 10/2006 | Kang et al. | |
| 2007/0052070 A1 | 3/2007 | Islam et al. | |
| 2009/0146280 A1* | 6/2009 | Shimazaki et al. | 257/676 |
| 2009/0283884 A1* | 11/2009 | Kang et al. | 257/676 |

FOREIGN PATENT DOCUMENTS

| | | |
|---|---|---|
| JP | 09-307050 | 11/1997 |
| JP | 2001-127229 A | 5/2001 |
| JP | 2005-023405 A | 1/2005 |
| JP | 2005-213573 A | 8/2005 |
| KR | 94-0010455 B1 | 10/1994 |
| KR | 10-1999-0016567 A | 3/1999 |
| KR | 10-2000-0007350 A | 2/2000 |
| KR | 10-0286631 B1 | 4/2001 |
| KR | 10-2007-0119758 A | 12/2007 |
| TW | 200636963 A | 10/2006 |
| TW | 200809360 A | 2/2008 |

OTHER PUBLICATIONS

Office Action dated May 18, 2012 in Korean Application No. 10-2008-0087689, filed Sep. 5, 2008.
Office Action dated Jun. 5, 2012 in Japanese Application No. 2011-525988, filed Sep. 7, 2009.
Office Action dated Mar. 21, 2013 in Taiwanese Application No. 098129899, filed Sep. 4, 2009.
Office Action dated Jan. 13, 2014 in Chinese Application No. 2009-801394703.
Office Action dated Nov. 20, 2013 in Korean Application No. 10-2011-0135392, filed Dec. 15, 2011.
Office Action dated Jul. 31, 2014 in Chinese Application No. 200980139470.3
Kim, J.K., et al. "Interface Adhesion Between Copper Lead frame and Epoxy Moulding Compound: Effects on Surface Finish, Oxidation and Dimples," *Electronic Components and Technology Conference*. 2000, pp. 601-608.
Lebbai, M., et al. "Effects of Dimple and Metal Coating on Interfacial Adhesion in Plastic Packages," *Journal of Electronic Materials*, 2003, vol. 32, No.6, pp. 564-573.

\* cited by examiner

LEAD FRAME AND MANUFACTURING METHOD THEREOF

CROSS-REFERENCE TO RELATED APPLICATION

This application is the U.S. national stage application of International Patent Application No. PCT/KR2009/005057, filed Sep. 7, 2009, which claims priority to Korean Application No. 10-2008-0087689, filed Sep. 5, 2008, the disclosures of each of which are incorporated herein by reference in their entirety.

TECHNICAL FIELD

The embodiment relates to a lead frame and a method for manufacturing the same.

BACKGROUND ART

A lead frame is one of components of a semiconductor package together with a semiconductor chip.

The lead frame serves as a lead to connect the outside and the inside of the semiconductor package with each other while serving as a frame to support the semiconductor chip.

Meanwhile, a lead frame according to the related art is used by plating a heterogeneous metal layer or an alloy layer on a substrate used as a base of the lead frame. The heterogeneous meal layer or the alloy layer prevents impurities of the substrate from being spread or prevents the substrate from being oxidized. In addition, the heterogeneous metal layer or the alloy layer can improve the adhesive strength with resin for an epoxy mold compound (EMC) in a packaging process.

However, when the heterogeneous metal layer or the alloy layer is plated on the surface of the substrate, the manufacturing cost may be increased. Particularly, when a heterogeneous material is plated, the adhesive strength with the substrate is low, so that defects may occur.

DISCLOSURE

Technical Problem

The embodiment provides a lead frame and a method for manufacturing the same.

The embodiment relates to a lead frame and a method for manufacturing the same, capable of improving the characteristics of the lead frame through the simple manufacturing process at the economical manufacturing cost.

Technical Solution

According to the embodiment, the lead frame includes a copper substrate, and a rough copper layer having surface roughness of 110 nm to 300 nm and formed over a surface of the copper substrate.

According to the embodiment, the lead frame includes a copper substrate, a rough copper layer over the copper substrate, a Ni layer over the rough copper layer, a Pd layer over the Ni layer, and an Au layer over the Pd layer.

According to the embodiment, a method for manufacturing a lead frame includes preparing a copper substrate, and forming a rough copper layer by electrically plating the copper substrate in a copper sulfate pentahydrate solution.

Advantageous Effects

The embodiment can provide a lead frame and a method for manufacturing the same.

The embodiment can provide a lead frame and a method for manufacturing, capable of improving the characteristics of the lead frame through the simple manufacturing process at the economical manufacturing cost.

BEST MODE

Mode for Invention

Figure 1:
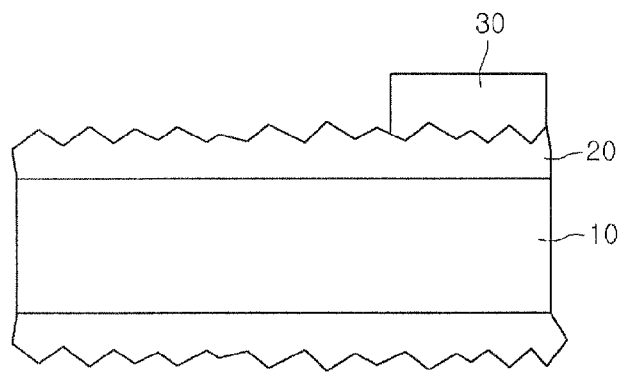
FIG. 1 is a sectional view showing a lead frame according to a first embodiment.

In the description of embodiments, it will be understood that when a layer (or film), region, pattern, or structure is referred to as being 'on' or 'under' a substrate, another layer (or film), region, pad, or pattern, it can be directly 'on' or 'under' the substrate, another layer (or film), region, pad, or other patterns, or one or more intervening layer may be present.

In the drawings, the thickness or size of each layer is exaggerated, omitted, or schematically illustrated for convenience of explanation and the sizes of elements do not totally reflect the actual sizes of the elements.

FIG. 1 is a sectional view showing a lead frame according to a first embodiment.

Referring to FIG. 1, the lead frame according to the first embodiment includes a copper substrate 10 and a rough copper layer 20 formed on the surface of the copper substrate 10.

A silver plating layer 30 may be locally formed on the surface of the rough copper layer 20.

The copper substrate 10 includes copper (Cu) or an alloy mainly containing Cu. The copper substrate 10 may include various impurities to improve the mechanical and electrical characteristics of copper. For example, the copper substrate 10 may include at least one selected from the group consisting of nickel (Ni), magnesium (Mg), and silicon (Si) in addition to Cu.

The rough copper layer 20 may have an average thickness of 0.30 μm to 0.6 μm and surface roughness of 110 nm to 300 nm.

Different from an existing lead frame formed with a plating layer including a heterogeneous material, the rough copper layer 20 is formed on the surface of the copper substrate 10. Accordingly, the adhesive strength between the copper substrate 10 and the rough copper layer 20 is stronger than that between the copper substrate 10 and the plating layer including the heterogeneous material.

The rough copper layer 20 can prevent impurities of the copper substrate 10 from being spread due to heat generated in the manufacturing process, and prevent the copper substrate 10 from being oxidized due to moisture of air.

Meanwhile, since the rough copper layer 20 according to the embodiment has great surface roughness due to a large grain size, the rough copper layer 20 has an enhanced adhesive strength with resin for the EMC in a packaging process.

In other words, since the rough copper layer 20 has great surface roughness of 110 nm to 300 nm, the adhesive strength between the rough copper layer 20 and the resin is increased due to an anchoring effect.

Figure 2:
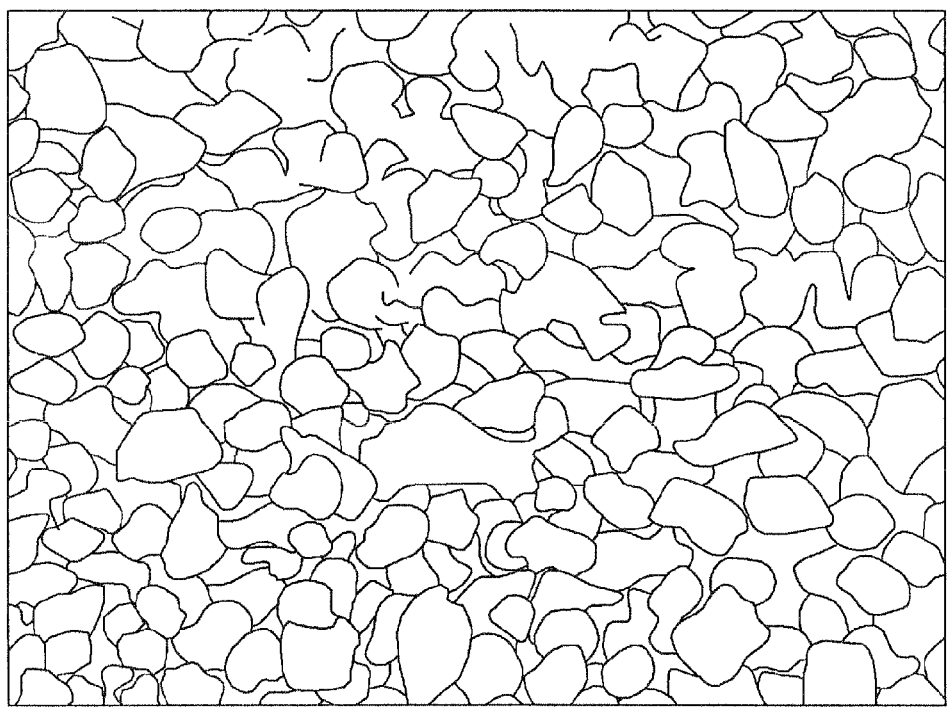
FIGS. 2 and 3 are enlarged views showing the surface of a rough copper layer according to the first embodiment.
Figure 3:
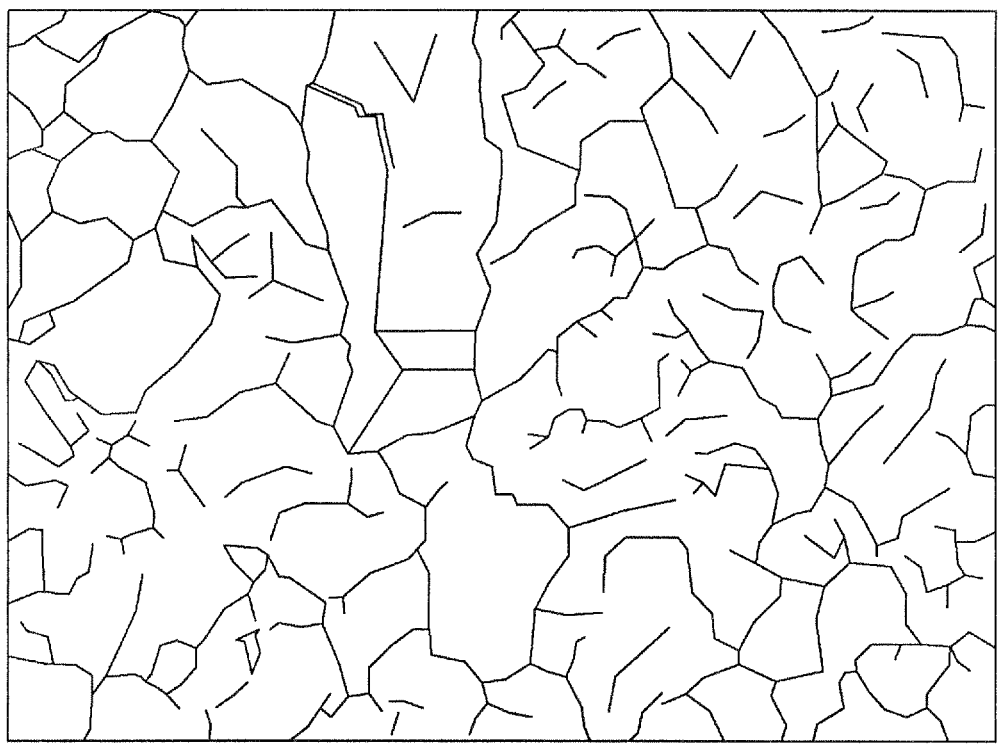

FIGS. 2 and 3 are enlarged views showing the surface of the rough copper layer 20 according to the first embodiment.

As shown in FIGS. 2 and 3, the surface of the rough copper layer 20 is very rough.

Meanwhile, the silver plating layer 30 may be formed in order to improve weldability and electrical conductivity with an electronic device such as a semiconductor chip. For example, the silver plating layer 30 may have a thickness of aim to 5 μm.

Figure 4:
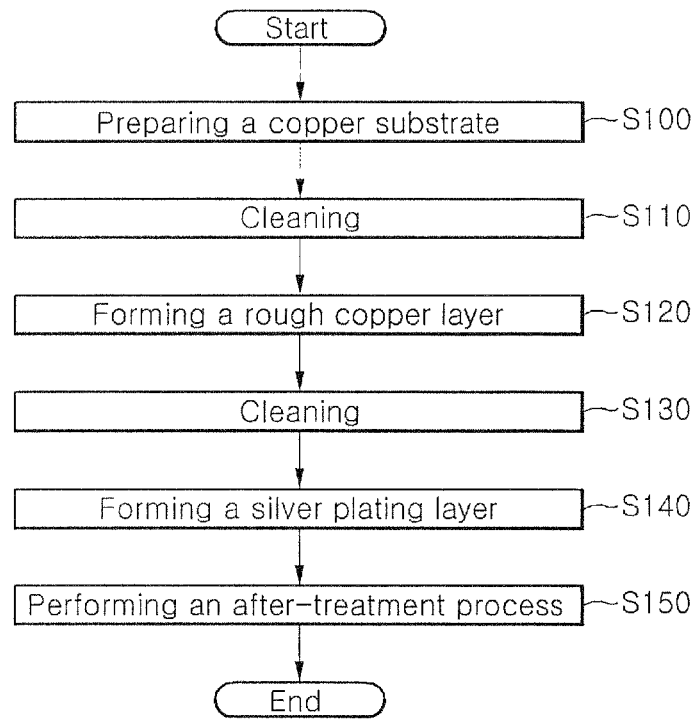
FIG. 4 is a view showing a method for manufacturing the lead frame according to the first embodiment.

FIG. 4 is a flowchart showing a method for manufacturing the lead frame according to the first embodiment.

According to the embodiment, the lead frame can be manufactured through a reel-to-reel process, or can be manufactured in the unit of an individual product corresponding to each strip. In addition, the lead frame can be manufactured through an in-line process.

Referring to FIG. 4, the copper substrate 10 is prepared (S100). The copper substrate 10 mainly includes Cu, and may include various impurities to improve mechanical and electrical characteristics of Cu. For example, the copper substrate 10 may include at least one selected from the group consisting of Ni, Mg, and Si in addition to Cu.

Then, the copper substrate 10 is cleaned. The cleaning process may be performed in the sequence of degreasing, washing, pickling, and washing processes.

Thereafter, the rough copper layer 20 is formed on the surface of the copper substrate 10 (S120).

The rough copper layer 20 is formed through an electroplating scheme using a copper sulfate pentahydrate ($CuSO_4 \cdot 5H_2O$) solution. The electroplating scheme may be performed with Cu ions having the density of 5 g/L to 70 g/L at the current density of 3ASD to 7ASD for time of 10 seconds to 14 seconds. As a result, the rough copper layer 20 may be formed at a thickness of 0.3 μm to 0.6 μm with the surface roughness of 110 nm to 300 nm. The $CuSO_4 \cdot 5H_2O$ solution may contain various additives if necessary.

If the density of the Cu ions is less than 5 g/L, a small amount of grains are formed through plating so that the adhesive strength is less improved. If the density of the Cu ions is greater than 70 g/L, large grains are wholly formed, so that surface roughness can be increased.

If the current density is less than 3ASD, the surface roughness of the rough copper layer 20 is low. If the current density is great than 7ASD, the rough copper layer 20 is excessively plated, so that the sizes of grains formed on the rough copper layer 20 are irregular. Accordingly, uniform surface face roughness cannot be obtained.

If plating time is shorter than 10 seconds, the rough copper layer 20 may formed with low surface roughness. If the plating time is longer than 40 seconds, the rough copper layer 20 may be excessively plated, so that the sizes of grains on the rough copper layer 20 are irregular. Accordingly, uniform surface roughness cannot be obtained.

If the surface roughness of the rough copper layer 20 is lower than 110 nm, the adhesive strength is less improved. If the surface roughness of the rough copper layer 20 is greater than 300 nm, uniform surface roughness cannot be obtained.

The $CuSO_4 \cdot 5H_2O$ solution forms a plating layer having greater surface roughness as compared with another Cu plating solution, for example, copper cyanide (CuCN). Particularly, according to the embodiment, a plating scheme is performed by using the $CuSO_4 \cdot 5H_2O$ solution at the high current density, so that the rough copper layer 20 having a thickness of 0.3 μm to 0.6 μm can be formed.

If the rough copper layer 20 has a thickness thinner than 0.3 μm, the rough copper layer 20 may have low surface roughness. If the rough copper layer 20 has a thickness thicker than 0.6 μm, the rough copper layer 20 is excessively plated, so that the sizes grains formed on the rough copper layer 20 are irregular. Accordingly, uniform surface roughness cannot be obtained.

For example, according to the embodiment, the electroplating scheme may be performed with respect to the copper substrate 10 with Cu ions having the density of 40 g/L at the current density (current amount per unit area) of 5ASD for plating time of 30 seconds, thereby forming the rough copper layer 20 at a thickness of 0.5 μm with the surface roughness of 200 nm.

Next, the copper substrate 10 formed with the rough copper layer 20 is cleaned (S130). The cleaning process may be performed as a washing process.

Then, the silver plating layer 30 is locally formed on the rough copper layer 20 (S140).

Next, an after-treatment process is performed after the silver plating layer 30 has been formed (S150).

The after-treatment process includes an electrolytic stripping process, a pickling process, an edge treatment process, a washing process, and a drying process for the silver plating layer 30.

As a result, the lead frame shown in FIG. 1 can be manufactured.

As described above, in the method for manufacturing the lead frame according to the first embodiment, the rough copper layer 20 is formed on the copper substrate 10 through an electroplating process. The electroplating process enables the surface roughness of the rough copper layer 20 to be increased by adjusting the density of Cu ions, the current density, time, and the introduction of additives.

Accordingly, according to the embodiment, the characteristic of the lead frame can be improved without forming a plating layer including a heterogeneous material.

Figure 5:
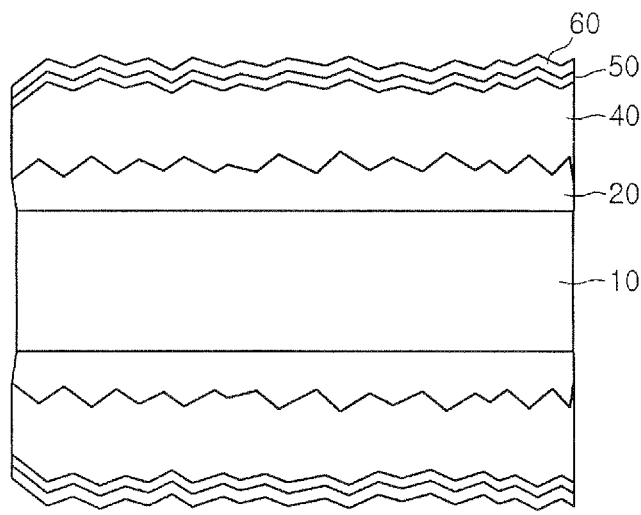
FIG. 5 is a view showing a lead frame according to a second embodiment.

FIG. 5 is a view showing a lead frame according to a second embodiment.

Referring to FIG. 5, although the first embodiment is disclosed in that the silver plating layer 30 is formed on the rough copper layer 20, a nickel (Ni) layer 40, a palladium (Pd) layer 50, and a gold (Au) layer 60 can be sequentially plated on the rough copper layer 20 according to the second embodiment.

The Ni layer 40 is plated on the rough copper layer 20, the Pd layer 50 is plated on the Ni layer 40, and the Au layer 60 is plated on the Pd layer 50.

For example, the Ni layer 40 may be formed at the thickness of 0.5 μm to 2.5 μm. The Pd layer 50 may be formed at the thickness of 0.02 μm to 0.15 μm. The Au layer 60 may be formed at the thickness of 0.003 μm to 0.015 μm.

Since the Ni layer 40, the Pd layer 50, and the Au layer 60 are formed on the rough copper layer 20, the Au layer 60 may have the surface roughness of 90 nm to 270 nm.

The lead frame according to the second embodiment includes the rough copper layer 20, the Ni layer 40, the Pd layer 50, and the Au layer 60 formed on the copper substrate 10, so that the soldering characteristic of the lead frame can be improved.

Figure 6:
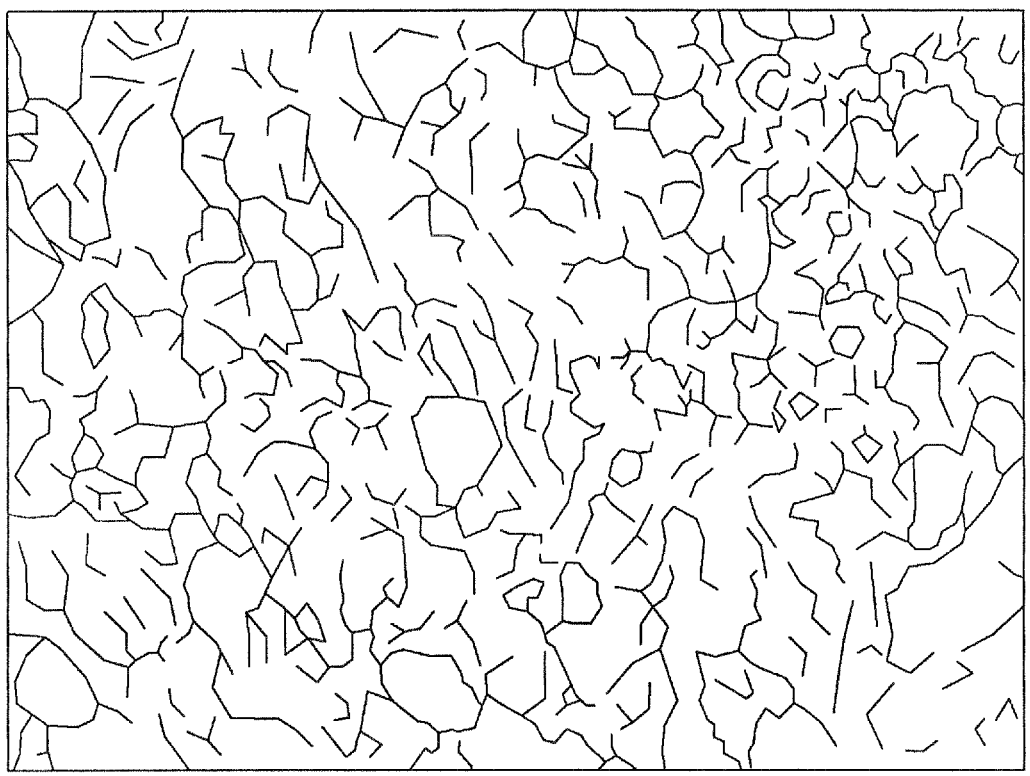
FIG. 6 is an enlarged view showing the surface of a gold layer according to the second embodiment.

FIG. 6 is an enlarged view showing the surface of the Au layer according to the second embodiment.

As shown in FIG. 6, the surface of the Au layer 60 is very rough due to the surface roughness of the rough copper layer 20.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

The embodiments can be adapted to a lead frame and a method for manufacturing the same.

The invention claimed is:

1. A lead frame comprising:
a copper substrate, wherein the copper substrate includes nickel (Ni), magnesium (Mg), and silicon (Si);
a rough copper layer having surface roughness of 110 nm to 300 nm and formed over a surface of the copper substrate; and
a metal layer with a rough upper surface formed over the rough copper layer, wherein the rough upper surface of the metal layer has a rough surface profile different from that of the rouge copper layer.

2. The lead frame of claim 1, further comprising a silver plating layer locally formed over the rough copper layer.

3. The lead frame of claim 1, wherein the rough copper layer has a thickness of 0.3 μm to 0.6 μm.

4. The lead frame of claim 1, wherein the metal layer with a rough upper surface is formed of nickel (Ni), palladium (Pd), or gold (Au).

5. A lead frame comprising:
a copper substrate, wherein the copper substrate includes nickel (Ni), magnesium (Mg), and silicon (Si);
a rough copper layer over the copper substrate;
a Ni layer over the rough copper layer;
a Pd layer over the Ni layer; and
an Au layer over the Pd layer;
wherein the Ni layer, Pd layer, and Au layer each has a rough upper surface with a rough surface profile different from that of the rough copper layer.

6. The lead frame of claim 5, wherein the Au layer has surface roughness of 90 nm to 270 nm.

7. The lead frame of claim 5, wherein the Ni layer is thicker than the Pd layer, and the Pd layer is thicker than the Au layer.

8. A method for manufacturing a lead frame, the method comprising:
preparing a copper substrate, wherein the copper substrate includes nickel (Ni), magnesium (Mg), and silicon (Si);
forming a rough copper layer by electrically plating the copper substrate in a copper sulfate pentahydrate solution; and
forming a metal layer with a rough upper surface over the rough copper layer, wherein the rough upper surface of the metal layer has a rough surface profile different from that of the rough copper layer.

9. The method of claim 8, wherein the rough copper layer is formed by using the copper sulfate pentahydrate solution containing copper ions having density of 5 g/L to 70 g/L at current density of 3 ASD to 7 ASD for time of 10 seconds to 40 seconds.

10. The method of claim 8, wherein the rough copper layer has surface roughness of 110 nm to 300 nm.

11. The method of claim 8, wherein the rough copper layer has a thickness of 0.3 μm to 0.6 μm.

12. The method of claim 8, further comprising locally forming a silver plating layer on the rough copper layer.

13. The method of claim 8, wherein the metal layer with a rough upper surface is formed of Ni, Pd, or Au.

14. The method of claim 13, wherein the Au layer has surface roughness of 90 nm to 270 nm.

* * * * *